United States Patent [19]

Tyrey

[11] 4,037,177
[45] July 19, 1977

[54] RADIO-FREQUENCY COUPLER

[76] Inventor: Elasco A. Tyrey, 239 Estridge, St. Louis, Mo. 63137

[21] Appl. No.: 663,632

[22] Filed: Mar. 3, 1976

[51] Int. Cl.$^2$ .................. H03H 7/10; H03H 7/38; H03H 7/46; H03H 7/14

[52] U.S. Cl. .......................... 333/32; 333/8; 333/70 R; 333/76; 343/858

[58] Field of Search ............... 333/70 R, 24 R, 24 C, 333/1, 6, 8, 79, 76, 32, 82 R; 343/715, 745, 858, 749, 750; 325/12, 16, 21, 25, 158, 180, 362, 477

[56] References Cited

U.S. PATENT DOCUMENTS

| | | | |
|---|---|---|---|
| 2,855,508 | 10/1958 | Barlow et al. | 333/76 X |
| 3,725,942 | 4/1973 | Ukmar | 343/715 |

OTHER PUBLICATIONS

Friedman - "Antenna Duplexer" in Electronics Illustrated, Fawcett, Greenwich, Conn., Mar. 1962, vol. 5, No. 2; pp. 66, 67, 108, 110.

Primary Examiner—Alfred E. Smith
Assistant Examiner—Marvin Nussbaum
Attorney, Agent, or Firm—Koenig, Senniger, Powers and Leavitt

[57] ABSTRACT

A radio-frequency coupler comprising a first terminal for interconnection with a conventional automobile receiving antenna used for receiving rf transmissions within a first radio-frequency band, a second terminal for interconnection with a receiver operating within the first radio-frequency band and a third terminal for interconnection with a transceiver operating within a second frequency band different from the first band. A first rf transmission path extends between the first terminal and the second terminal and a second rf transmission path extends between the first terminal and the third terminal. A first resonant circuit is connected in the first rf transmission path and tuned to pass rf transmissions in the first band but substantially block those in the second band. A second resonant circuit is connected in the second rf transmission path and tuned to resonate at a frequency within the second band so that rf transmissions within the second band are passed but those within the first band are substantially blocked. A third resonant circuit is connected between the third terminal and electrical ground and tuned to resonate at a frequency outside the second band. The second and third resonant circuits form a series-connected path between the first terminal and electrical ground and the impedance of the third resonant circuit at the second frequency band allows maximum rf energy within the second band to be transferred between the antenna and the transceiver thereby permitting the conventional automobile receiving antenna normally used only for receiving rf transmissions within the first frequency band to also be used for sending and receiving rf transmissions within the second frequency band.

9 Claims, 3 Drawing Figures

RADIO-FREQUENCY COUPLER

BACKGROUND OF THE INVENTION

This invention relates to radio frequency couplers and more particularly to a coupler for use with a conventional automobile receiving antenna so that such an antenna may operate with transceivers which transmit and receive rf transmissions outside the frequency band at which the antenna normally operates.

Sales of CB equipment have greatly increased in recent years, especially sales of mobile equipment such as transceivers which are installed in automobiles, recreational vehicles, trucks, etc., and which are used for two-way communications between these vehicles on and off out nation's highways. To properly use these transceivers usually necessitates the installation of an antenna on the vehicle which is specially designed for transmissions within the CB frequency range, i.e., 26.965 – 27.105 MHZ. Unfortunately, these antennas are quite distinctive in appearance and thus readily identify a vehicle on which they are installed as containing CB equipment. As a consequence, persons intent on stealing this type of radio equipment can easily spot vehicles in which they are installed and thefts of mobile CB equipment have greatly increased. Unfortunately, this equipment, once stolen, is difficult to trace and is seldom recovered by the owner.

One approach to the theft problem involves replacing the conventional receiving antenna with which most vehicles having a radio are equipped with a "disguise" antenna, i.e., an antenna that looks like a conventional receiving antenna but which is designed for CB frequency operation. While this may satisfactorily disguise the vehicle to a thief, the performance of the vehicle radio, which is not designed to operate with a CB antenna system, is greatly degraded. Consequently radio-frequency couplers have been designed for purposes of matching a radio to the CB antenna system, but while this may permit satisfactory performance to be obtained from the radio, present coupler design is such that this is accomplished with some degradation in the performance of the CB equipment. Further, the owner of the vehicle not only has the considerable expense of purchasing two separate items, but he must also have the original vehicle antenna removed, which is both a troublesome and time consuming proposition, before the new items can be installed and tested.

A second and less complicated approach retains the conventional receiving antenna already on the vehicle and requires only the addition of a radio-frequency coupler to match the radio receiver and CB equipment to the receiving antenna system. While this is also a less expensive approach than the aforementioned one, such couplers do not effect a good match between the antenna and the CB transceiver thereby reducing substantially the transfer of rf power. As a consequence, the effective range of the CB equipment is greatly diminished because of diminished signal strength and the vehicle owner is unable to realize the full potential of this equipment.

SUMMARY OF THE INVENTION

Among the several objects of the invention may be noted the provision of a radio-frequency coupler which permits a conventional receiving antenna installed in a vehicle to be used with a transceiver installed in the vehicle that operates at a frequency band different from that at which the antenna is designed to operate thereby to disguise the fact that the transceiver is installed in the vehicle; the provision of such a coupler which allows both the transceiver and a conventional receiver such as the radio installed in the vehicle to use one antenna system; the provision of such a coupler which is designed for obtaining optimum performance from both the conventional receiver and the transceiver despite their operating within different frequency bands; the provision of such apparatus which indicates when optimum performance is being obtained from the transceiver; and the provision of such a coupler which is low in cost, easy to install and reliable in operation.

Briefly, a radio-frequency coupler of this invention comprises a first terminal for interconnection with a conventional automobile receiving antenna used for receiving rf transmissions within a first band of radio frequencies, a second terminal for interconnection with a receiver operating within the first band of radio frequencies and a third terminal for interconnection with a transceiver operating within a second band of radio frequencies different from the first band. A first rf transmission path extends between the first terminal and the second terminal and a second rf transmission path extends between the first terminal and the third terminal. A first resonant circuit is connected in the first rf transmission path and tuned to offer a first impedance to rf transmissions within the first band of frequencies but a second and higher impedance to rf transmissions within the second band of frequencies thereby to pass rf transmissions in the first band but substantially block those in the second band. A second resonant circuit is connected in the second rf transmission path and tuned to resonate at a frequency within the second frequency band thereby to offer a first impedance to rf transmissions within the first band of frequencies but a second and lower impedance to rf transmissions within the second band of frequencies so that rf transmissions within the second band are passed but those within the first band are substantially blocked. A third resonant circuit is connected between the third terminal and electrical ground and tuned to resonate at a frequency outside the second band of frequencies. The second and third resonant circuits form a series-connected path between the first terminal and electrical ground and the impedance of the third resonant circuit at the second band of frequencies allows maximum rf energy within the second band of frequencies to be transferred between the antenna and the transceiver thereby permitting the conventional automobile receiving antenna normally used only for receiving rf transmissions within the first frequency band to also be used for sending and receiving rf transmissions within the second frequency band. Other objects and features will be in part apparent and in part pointed out hereinafter.

BRIEF DESCRIPTION OF THE DRAWINGS

Corresponding reference characters indicate corresponding parts throughout the several views of the drawings.

DESCRIPTION OF A PREFERRED EMBODIMENT

Figure 2:
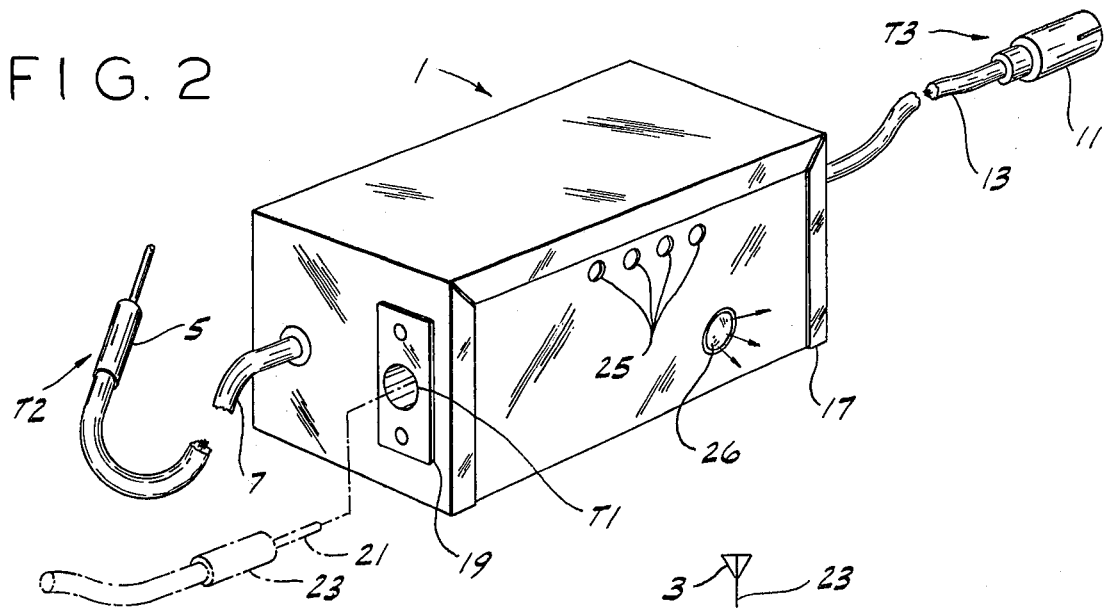
FIG. 2 is a perspective of a radio-frequency coupler of the invention for installation in a vehicle.
Figure 1:
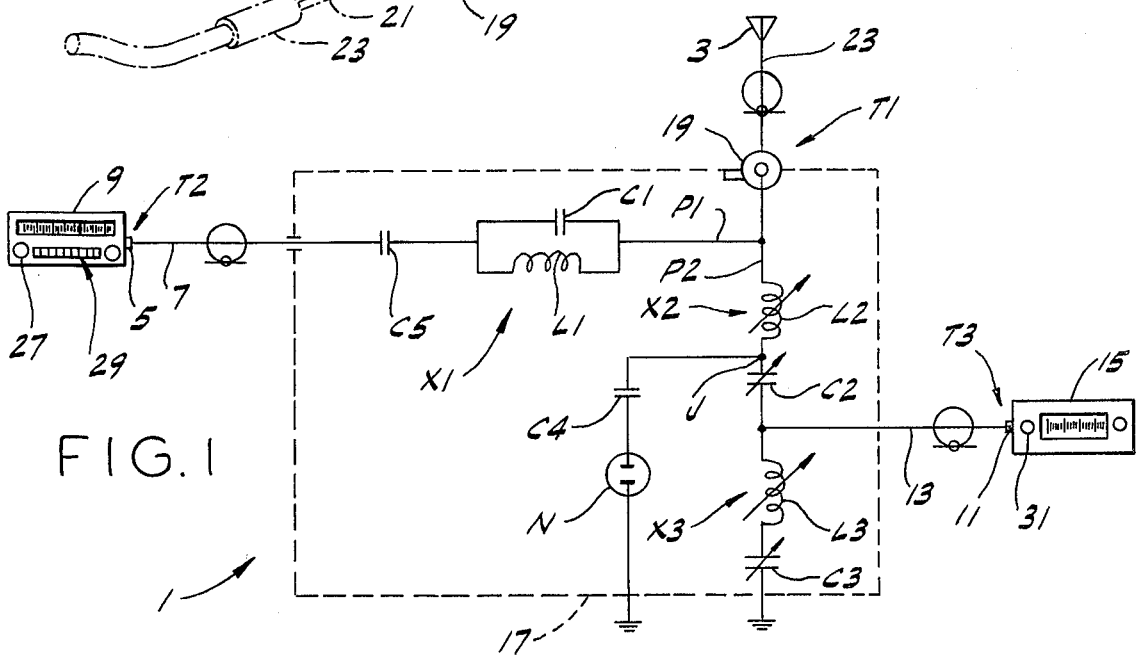
FIG. 1 is a schematic diagram of a radio-frequency coupler of the invention.

Referring now to the drawings, a radio-frequency coupler of the invention is indicated generally at 1. Coupler 1 has a first terminal T1 for interconnection with an antenna 3 which is a conventional automobile receiving antenna that receives rf transmissions within a first band FB1 of radio frequencies, e.g., the range of frequencies between 0.54 MHZ and 1.60 MHZ (the AM radio frequency band). Coupler 1 also has a second terminal T2 (which is constituted as shown by a male plug-in connector 5 attached to a coaxial cable 7 or by any other suitable electrical connector arrangement) for interconnection with a receiver 9 which operates within frequency band FB1, receiver 9 being, for example, an automobile radio of standard design. Further, coupler 1 has a third terminal T3 (which is constituted as shown by a coaxial connector 11 attached to a coaxial cable 13 or by any other suitable electrical connector arrangement) for interconnection with a transceiver 15 which operates within a second band FB2 of radio frequencies, transceiver 15 being, for example, a mobile Citizens Band (CB) transceiver operating, for example, in the range of frequencies between 26.965 MHZ and 27.105 MHZ.

Coupler 1 includes a first and a second rf transmission path designated P1 and P2 respectively. First transmission path P1 extends between terminal T1 and terminal T2 of coupler 1 while second transmission path P2 extends between terminal T1 and terminal T3.

Figure 3:
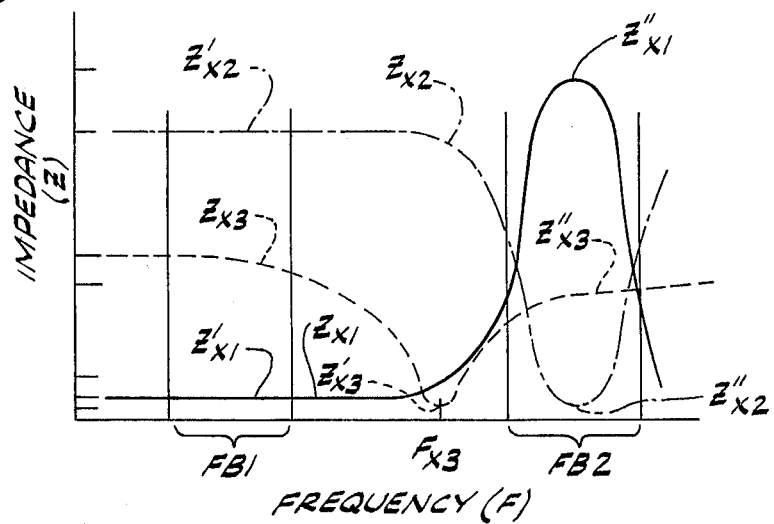
FIG. 3 is a graph in which impedance vs. frequency characteristics of resonant circuits included in the coupler are plotted to aid in understanding how the coupler operates.

A first resonant circuit generally indicated X1 is connected in first transmission path P1 and is comprised of an inductor L1 and a capacitor C1 which are connected in parallel. Circuit X1 is therefore a parallel-resonant circuit whose impedance is greatest at the frequency to which the circuit is tuned. If, for example, inductor L1 is a coil formed by 8 turns of 16 gauge wire with a ¼ inch inside coil diameter, and if, for example, capacitor C1 is a 150 pf capacitor, parallel-resonant circuit X1 resonates at a frequency within band FB2 as shown by curve $Z_{X1}$ in FIG. 3. Circuit X1 then offers a first and very low impedance $Z'_{X1}$ to rf transmissions within band FB1 but a second and much higher impedance $Z''_{X1}$ to rf transmissions within band FB2. As a consequence, rf transmissions within band FB1 readily pass between terminals T1 and T2 over path P1 to receiver 9 while transmissions within band FB2 are blocked and do not reach receiver 9.

A second resonant circuit generally indicated X2 is connected in second transmission path P2 and is comprised of an inductor L2 and a capacitor C2 connected in series. Circuit X2 is thus a series-resonant circuit whose impedance is lowest at the frequency to which the circuit is tuned. Inductor L2 is preferably a variable inductor which may, for example, be a coil formed by 9 turns of 16 gauge wire with a ¼ inch inside coil diameter. Capacitor C2 is preferably a variable capacitor which may, for example, have a capacitance value of up to 100 pf. It will be understood, however, that for purposes of this invention only one of the two components in circuit X2 need be variable. As a result, series-resonant circuit X2 is tunable to resonate at a frequency within band FB2 as shown by curve $Z_{X2}$ in FIG. 3. Circuit X2 thus offers a first and relatively high impedance $Z'_{X2}$ to rf transmissions within band FB1 but a second and lower impedance $Z''_{X2}$ to rf transmissions within band FB2. Rf transmissions within frequency band FB2 therefore readily pass between terminals T1 and T3 over path P2 to and from antenna 3 and transceiver 15, while transmissions within band FB1 are blocked and do not effect transceiver 15.

A third resonant circuit generally indicated X3 is connected between terminal T3 and electrical ground. Circuit X3 is constituted by an inductor L3 and a capacitor C3 connected in series. Circuit X3 is thus a series-resonant circuit and circuits X2 and X3 form a series-connected path between terminal T1 and electrical ground. Inductor L3 is preferably a variable inductor which may, for example, be a coil formed by 19 turns of 16 gauge wire with a ¼ inch inside coil diameter. Capacitor C3 is preferably a variable capacitor which may, for example, have a capacitance value of up to 68 pf. Again, however, it will be understood that only one of the two components in circuit X3 need be variable. As a result, series resonant circuit X3 is tunable to resonate at a frequency $F_{X3}$ which is outside frequency band FB2 as shown by curve $Z_{X3}$ in FIG. 3. Because circuit X3 exhibits a minimum impedance $Z'_{X3}$ at a frequency not within band FB2, the impedance exhibited by circuit X3 at frequency band FB2 is a somewhat higher impedance $Z''_{X3}$.

The impedance of series-resonant circuit X3 at frequencies within band FB2 allows maximum rf energy within band FB2 to be transferred between antenna 3 and transceiver 15. Since transceiver 15 is both a transmitter and a receiver, conventional automobile receiving antenna 3 normally used only for receiving rf transmissions within frequency band FB1 may now also be used for sending and receiving rf transmissions within frequency band FB2. Further, since band FB2 corresponds to the CB frequency band, transceiver 15 is operable using no antenna other than antenna 3 and therefore no installations are required on the outside of the vehicle which would indicate that CB equipment is installed therein.

The relative amount of rf energy in band FB2 transferred to antenna 3 from transceiver 15 is visually indicated by a signal lamp N which is connected between junction J of inductor L2 and capacitor C2 and electrical ground. Lamp N which is preferably a neon bulb, such as an Ne-2 or an NE-54, is optionally provided in coupler 1 to aid in tuning resonant circuits X2 and X3 to obtain the maximum transfer of rf energy in band FB2 over path P2 to the antenna from the transceiver. Preferably, a capacitor C4 is interconnected between junction J of inductor L2 and capacitor C2 and signal lamp N, and couples rf energy transferred over path P2 to lamp N. Lamp N is illuminated by the rf energy it receives, and the intensity of this illumination is a function of the amount of energy transferred. The peak or maximum intensity of this illumination occurs when the amount of rf energy transferred is a maximum.

To obtain the transfer of the maximum amount of energy in band FB2 to antenna 3 from transceiver 15, the user of coupler 1 observes lamp N while tuning resonant circuits X2 and X3. Since both these circuits must be properly tuned to obtain maximum energy transfer, the user alternately tunes each circuit and may have to repeat this tuning process a number of times to obtain the maximum intensity of illumination of lamp N. When, however, peak illumination intensity is obtained, the user knows that circuit X2 is tuned to the appropriate frequency within band FB2 and that circuit X3 is tuned to the appropriate frequency $F_{X3}$ by which maximum energy transfer within band FB2 over path P2 is achieved. Capacitor C4, which may, for example, have a capacitance value of 50 pf. also serves to limit the amount of energy lamp N receives and thus also affords burnout protection for the lamp.

The components comprising coupler 1 are housed in a box or case 17 which is of a size that is easy to install under the dashboard of a vehicle or some other suitably convenient location. For this arrangement, which is shown in FIG. 2, terminal T1 is constituted by a case-mounted receptacle 19. Interconnection of coupler 1 with antenna 3 is therefore accomplished by inserting the male plug-in connector 21 of an antenna coax cable 23 into receptacle 19. Again, it will be understood that this terminal T1 may be constituted by any other suitable electrical connector arrangement. Two coaxial cables are routed from case 17; cable 7 which has connector 5 for interconnecting coupler 1 with receiver 9 and cable 13 which has connector 11 for interconnecting coupler 1 with transceiver 15. Four holes 25 are drilled into one side of case 17 so that an adjusting tool may be inserted inside the case to vary the inductance and capacitance values of inductors L2 and L3 and capacitors C2 and C3 respectively to tune resonant circuits X2 and X3 to obtain the maximum energy transfer in frequency band FB2 between antenna 3 and transceiver 15. Further, a hole 26 is provided in case 17 so that lamp N may be observed by the user while tuning circuits X2 and X3 to obtain maximum energy transfer. It will be understood, however, that lamp N may be located on the outside of case 17 by means of an appropriate mounting arrangement.

For rf transmissions within frequency band FB1, antenna 3, coax cable 23, path P1 and resonant circuit X1 in path P1 and the input of receiver 9 are all part of a resonant circuit which is tuned to operate at a frequency within band FB1. The particular operating frequency is determined by the channel selected by the motorist using a tuning control 27 or a pushbutton 29 on radio 9. Rf transmissions in band FB1 received by antenna 3 are routed through cable 23 to terminal T1 of coupler 1. Because resonant circuit X1 is tuned to present a low impedance to rf transmissions within band FB1 while resonant circuit X2 presents a high impedance at these frequencies, these transmissions follow path P1 to terminal T2 and receiver 9. Further, because the antenna-to-receiver transmission path is a resonant circuit, this is accomplished with little loss of signal. A limiting capacitor C5 is connected in path P1 between resonant circuit X1 and terminal T2 to prevent receiver 9 from being detuned. This further helps to maximize the amount of energy in band FB1 transferred between antenna 3 and receiver 9. Capacitor C5 may, for example, have a capacitance value of 75 pf.

With respect to transmissions within band FB2, antenna 3, coax cable 23, path P2 and resonant circuit X2 in path P2 and transceiver 15 are all part of a resonant circuit which is tuned to operate at a frequency within band FB2. In practice, a tuning control 31 on transceiver 15 is adjusted to select a mid-range frequency within the CB range, i.e., a frequency slightly over 27 MHZ. Once that frequency is selected, resonant circuit X2 is tuned to that frequency by adjusting the values of inductor L2 and capacitor C2. When this is accomplished, transceiver 15 may be operated at any of the 23 channels selectable within the CB range without the need of retuning circuit X2 to the particular operating frequency.

It has been experimentally found that if resonant circuit X3 is tuned to resonate at a frequency $F_{X3}$ which is between 21 MHZ and 22 MHZ, the impedance $Z''_{X3}$ presented by circuit X3 at frequency band FB2 approximates 52 ohms which is the characteristic impedance of CB systems. With resonant circuit X3 properly tuned, a transmission within band FB2 received by antenna 3 is routed through coax cable 23 to terminal T1. Resonant circuit X1 presents a high impedance to transmissions within band FB2 while resonant circuit C2 presents a low impedance. Therefore, the received transmission passes over path P2. At terminal T3, the transmission encounters a low impedance path to the input of transceiver 15 and what is, in effect, a 52 ohm path to ground. If series resonant circuit X3 were tuned to resonate at a frequency within band FB2, there would be such a low impedance path from terminal T3 to ground that the received transmission would be shunted to ground and not received by transceiver 15. However, with circuit X3 tuned to the aforesaid frequency, a 52 ohm impedance is presented to transceiver 15 and this impedance matches the impedance of the system with which the transceiver is designed to operate. Consequently, no standing wave is present on the rf transmission path between antenna 3 and transceiver 15 and the rf transmissions are routed to the receiver with a minimum loss of signal.

When transceiver 15 is used for transmitting, the transceiver output sees the 52 ohm impedance presented by circuit X3. If the circuit X3 were tuned to resonate at a frequency within band FB2, the transceiver output would be effectively grounded. Instead, however, by presenting the transceiver output with a 52 ohm impedance (which is the same impedance as that of the usual CB antenna system with which the transceiver is designed to operate), essentially no standing wave is present on the path between transceiver 15 and antenna 3 and therefore, maximum rf energy within band FB2 is transferred to the antenna.

It will be understood by those skilled in the art that the effect of lengthening or shortening antenna 3 may be readily compensated for by adjusting resonant circuit X2. Further, it will be understood that coupler 1 may be used with radio transceivers or receivers other than CB equipment, for example, police radio equipment that operates in the 130 MHZ - 174 MHZ frequency band with the same advantageous results being obtained. This is accomplished by selecting different inductance and capacitance parameters for use in resonant circuits X1, X2 and X3. Also, these circuits may be formed on a printed circuit board using techniques well known in the art.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A radio-frequency coupler comprising:
  a first terminal for interconnection with a conventional automobile receiving antenna used for receiving rf transmissions within a first band of radio frequencies, a second terminal for interconnection with a receiver operating within the first band of radio frequencies and a third terminal for interconnection with a transceiver operating within a second band of radio frequencies different from the first band;

first and second rf transmission paths, the first rf transmission path extending between the first terminal and the second terminal and the second rf transmission path extending between the first terminal and the third terminal;

a first resonant circuit connected in the first rf transmission path and tuned to offer a first impedance to rf transmissions within the first band of frequencies but a second and higher impedance to rf transmissions within the second band of frequencies thereby to pass rf transmissions in the first band but substantially block those in the second band;

a second resonant circuit connected in the second rf transmission path and tuned to resonate at a frequency within the second frequency band thereby to offer a first impedance to rf transmissions within the first band of frequencies but a second and lower impedance to rf transmissions within the second band of frequencies so that rf transmissions within the second band are passed but those within the first band are substantially blocked; and a third resonant circuit connected between the third terminal and electrical ground and tuned to resonate at a frequency outside the second band of frequencies whereby the second and third resonant circuits form a series-connected path between the first terminal and electrical ground and the impedance of the third resonant circuit at the second band of frequencies allows maximum rf energy within the second band of frequencies to be transferred between the antenna and the transceiver thereby permitting the conventional automobile receiving antenna normally used only for receiving rf transmissions within the first frequency band to also be used for sending and receiving rf transmissions within the second frequency band.

2. A radio-frequency coupler as set forth in claim 1 wherein the first resonant circuit includes an inductor and a capacitor connected in parallel thereby making the first resonant circuit a parallel resonant circuit which is tuned to a frequency within the second band of frequencies.

3. A radio-frequency coupler as set forth in claim 1 wherein the second and third resonant circuits each include an inductor and a capacitor connected in series thereby making said circuits series resonant circuits.

4. A radio-frequency coupler as set forth in claim 3 wherein at least one of the inductor and capacitor components of the second resonant circuit is variable whereby the second resonant circuit is selectively adjustable to be tuned to a particular frequency within the second band of frequencies.

5. A radio-frequency coupler as set forth in claim 4 wherein at least one of the inductor and capacitor components of the third resonant circuit is variable whereby the third resonant circuit is selectively adjustable to be tuned to resonate at the frequency outside the second band of frequencies which causes the third resonant circuit to have an impedance at the second band of frequencies which results in the maximum rf energy within the second frequency band being transferred between the antenna and transceiver.

6. A radio-frequency coupler as set forth in claim 1 further including a capacitor connected in the first transmission path between the first resonant circuit and the second terminal for limiting the capacitance in said transmission path thereby to keep the receiver from being detuned and to obtain a maximum transfer of rf energy within the first frequency band between the antenna and the receiver.

7. A radio-frequency coupler as set forth in claim 1 further including means for providing a visual indication of the relative amount of rf energy in the second band of frequencies transferred to the antenna from the transceiver.

8. A radio-frequency coupler as set forth in claim 7 wherein the second resonant circuit includes an inductor and a capacitor connected in series and the indication means includes a signal lamp connected between the junction of the inductor and the capacitor and electrical ground and which is responsive to the magnitude of the rf energy in the second frequency band transferred to the antenna from the transceiver, the intensity of illumination of said lamp being a function of the amount of rf energy transferred.

9. A radio-frequency coupler as set forth in claim 8 further including a capacitor interconnected between the aforesaid junction and the signal lamp for coupling rf energy transferred to the antenna from the transceiver to the lamp and for limiting the amount of energy so transferred to the lamp.

* * * * *